(12) United States Patent
Paik et al.

(10) Patent No.: US 11,472,933 B2
(45) Date of Patent: Oct. 18, 2022

(54) METHOD OF UNIFORMLY DISPERSING NICKEL-PLATED CONDUCTIVE PARTICLES OF SINGLE LAYER WITHIN POLYMER FILM BY APPLYING MAGNETIC FIELD TO POLYMER FILM AND METHOD OF FABRICATING ANISOTROPIC CONDUCTIVE FILM USING THE SAME

(71) Applicant: KOREA ADVANCED INSTITUTE OF SCIENCE AND TECHNOLOGY, Daejeon (KR)

(72) Inventors: Kyung Wook Paik, Daejeon (KR); Dal-Jin Yoon, Daejeon (KR); Junho Byeon, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/421,957

(22) Filed: May 24, 2019

(65) Prior Publication Data
US 2020/0239651 A1    Jul. 30, 2020

(30) Foreign Application Priority Data
Jan. 24, 2019    (KR) .................. 10-2019-0009376

(51) Int. Cl.
*H01B 1/22* (2006.01)
*C08J 5/18* (2006.01)
(Continued)

(52) U.S. Cl.
CPC ............... *C08J 5/18* (2013.01); *C08J 7/0423* (2020.01); *C08K 3/08* (2013.01); *C08K 9/02* (2013.01);
(Continued)

(58) Field of Classification Search
CPC ...... H05K 9/00; H05K 9/0075; H05K 9/0071; H05K 9/0073; H01F 27/365; B05C 1/08;
(Continued)

(56) References Cited

U.S. PATENT DOCUMENTS

| 4,737,112 A * | 4/1988 | Jin ..................... H01L 24/10 257/E21.511 |
| 2004/0112636 A1 * | 6/2004 | Kawai .................. H05K 3/061 174/263 |

(Continued)

FOREIGN PATENT DOCUMENTS

| KR | 10-1997-0074883 | 12/1997 |
| KR | 1003970630000 | 8/2003 |
| KR | 10-2012-0028583 | 3/2012 |
| KR | 1020180115383 | 10/2018 |
| KR | 10-20180115383 | * 12/2018 |

*Primary Examiner* — Tabassom Tadayyon Eslami
(74) *Attorney, Agent, or Firm* — Heslin Rothenberg Farley & Mesiti, P.C.

(57) ABSTRACT

Disclosed are a method of uniformly dispersing nickel-plated conductive particles of a single layer within a polymer film by applying a magnetic field to the polymer film and a method of fabricating an anisotropic conductive film using the same. The method of fabricating a film may include forming a liquefied polymer layer by roll-to-roll coating a polymer solution in which a plurality of conductive particles has been mixed, dispersing the plurality of conductive particles included in the liquefied polymer layer by applying a magnetic field to the liquefied polymer layer, and fabricating a solid polymer layer limiting a movement of the plurality of dispersed conductive particles by drying the liquefied polymer layer in which the plurality of conductive particles has been dispersed.

21 Claims, 23 Drawing Sheets

(51) Int. Cl.
*C08J 7/04* (2020.01)
*C08K 3/08* (2006.01)
*C08K 9/02* (2006.01)
*H05K 9/00* (2006.01)

(52) U.S. Cl.
CPC ............ *H01B 1/22* (2013.01); *H05K 9/0071* (2013.01); *H05K 9/0073* (2013.01); *H05K 9/0075* (2013.01); *C08K 2003/0862* (2013.01); *C08K 2201/001* (2013.01)

(58) Field of Classification Search
CPC ... H01B 5/16; H01B 1/20; H01B 1/22; H01B 1/14; H01B 17/64
USPC .......... 427/550, 547, 598; 264/108; 428/900
See application file for complete search history.

(56) References Cited

U.S. PATENT DOCUMENTS

| | | | |
|---|---|---|---|
| 2007/0116910 A1* | 5/2007 | Polykarpov | B32B 7/04 428/35.2 |
| 2007/0190360 A1* | 8/2007 | Sakamoto | B22F 3/18 428/692.1 |
| 2008/0311378 A1* | 12/2008 | Simpson | C08J 9/36 428/319.1 |
| 2010/0101700 A1* | 4/2010 | Liang | H05K 3/323 156/73.1 |
| 2012/0231689 A1* | 9/2012 | Kim | C08L 71/00 252/301.36 |
| 2014/0077485 A1* | 3/2014 | Raksha | C09D 5/29 283/67 |
| 2016/0093424 A1* | 3/2016 | Zhu | H01F 13/003 148/108 |

* cited by examiner (a)

(b)

METHOD OF UNIFORMLY DISPERSING NICKEL-PLATED CONDUCTIVE PARTICLES OF SINGLE LAYER WITHIN POLYMER FILM BY APPLYING MAGNETIC FIELD TO POLYMER FILM AND METHOD OF FABRICATING ANISOTROPIC CONDUCTIVE FILM USING THE SAME

CROSS REFERENCE TO RELATED APPLICATION

This application is based on and claims priority under 35 U.S.C. 119 to Korean Patent Application No. 10-2019-0009376, filed on Jan. 24, 2019, in the Korean Intellectual Property Office. The disclosures of which is herein incorporated by reference in their entireties.

BACKGROUND OF THE INVENTION

1. Technical Field

The following description relates to a method of uniformly dispersing nickel-plated conductive particles of a single layer within a polymer film by applying a magnetic field to the polymer film and a method of fabricating an anisotropic conductive film using the same.

2. Description of the Related Art

Adhesives used when electron packaging is performed are divided into a film form and a paste form depending on its use form, and are divided into conductive, anisotropic conductive, non-conductive adhesives depending on whether a conductive particle is included. In general, adhesives are classified into an anisotropic conductive film(s) (ACF(s)), an anisotropic conductive paste (ACP), a non-conductive film (NCF), and a non-conductive paste (NCP).

Particularly, in a next-generation ultra-fine pitch display technology, an ACF containing conductive particles is commonly used because high resolution and electrical stability are required. A bonding method between electronic parts using the ACF is a (lead-free) process of substituting the existing soldering process, and has a simple process and is a process that is eco-friendly and thermally more stable because an instant high temperature does not need to apply a product (low temperature process). Furthermore, such a bonding process has an advantage in that an ultra-fine electrode pitch (may be simply referred to as a "ultra-fine pitch") can be implemented because a process unit cost can be lowered using a glass substrate or a cheap substrate, such as polyester flex, and electrical bonding is performed using fine conductive particles.

Due to such advantages, the utilization of the adhesives (ACF, NCF) of a film form is expanded to as display packaging for a smart card, a liquid crystal display (LCD), a plasma display panel (PDP), and an organic light emitting diodes (OLED), and display packaging for computers, mobile phones, and communication systems, for example.

As the products of the electronic device market recently require high performance and multiple functions, the number of I/Os of a part is increased, and thus fine pitching or ultra-fine pitching in which the interval between electrodes becomes fine is indispensable. However, the greatest problem in fine pitch packaging is electrical bonding problem occurring due to a narrowed interval between bumps and between electrodes.

Particularly, in the case of electrical bonding using the ACF, a movement of conductive particles occurs due to a flow of thermosetting polymer resin upon performing thermal compression. A large amount of conductive particles must be used in order to prevent an open or high resistance bonding problem because the conductive particles are not captured between bumps and between electrodes or are captured in small quantity.

In this case, however, a short phenomenon, that is, an electrical error in which a large amount of the conductive particles is horizontally conductive between the electrodes, occurs because the conductive particles flowing along with the polymer are caught between the bumps or between the electrodes. Particularly, the fine pitching of a display product is rapidly performed, and such a problem becomes more severe.

FIG. 1 illustrates a conventional ACF for electrical bonding having two electrodes. More specifically, FIG. 1a shows a conventional ACF for electrical bonding having two electrodes before bonding. FIG. 1b shows a conventional ACF for electrical bonding having two electrodes after bonding.

Referring to FIG. 1, in a bonding process between the two electrodes of upper and lower substrates 20 and 21 using an ACF 10, a flow of polymer resin occurs and thus a wide gap between bumps is filled. After hardening is performed, stable electrical bonding must be vertically implemented and an insulation state must be horizontally maintained. In this case, the ACF 10 may be configured with a polymer layer 11, containing conductive particles, and an adhesive layer 12.

As the ultra-fine pitch electrical bonding technology is developed, however, the space between bumps and between electrodes tends to be reduced and the width of the bump and the electrode tends to be significantly reduced. If the conventional ACF 10 is used for such ultra-fine pitch bonding, problems, such as an electrical short phenomenon and an unstable contact state, occur.

FIG. 2 illustrates an electrical short phenomenon and unstable contact state occurring in conventional ultra-fine pitch bonding. More specifically, FIG. 2a shows a conventional ACF for electrical bonding having two electrodes of an ultra-fine pitch before bonding, and FIG. 2b shows a conventional ACF for electrical bonding having two electrodes of an ultra-fine pitch after bonding.

As shown in FIG. 2, the conventional ACF 10 does not suppress a movement of conductive particles attributable to a flow of resin in a bonding process, causes an electrical short circuit due to the bridging phenomenon of conductive particles between the bumps and between the electrodes of narrowed upper and lower substrates 20 and 21, and shows an unstable bonding characteristic attributable to a loss of lots of conductive particle.

Korean Patent Application Publication No. 10-2012-0028583 relates to conductive polymer adhesives using such a nano-fiber, and describes a technology regarding a nano-fiber ACF device including a nano-fiber layer, which suppresses a flow of conductive balls by putting the conductive balls (or conductive particle(s)) into the nano-fiber.

However, the nano-fiber ACF has problems in that it requires an additional bonding process, such as a resin flow, in order to increase the capture ratio per bump of a conductive ball and has low productivity compared to the existing ACF process.

Furthermore, in the case of an ACF for a fine pitch which is widely used for electrical bonding, Japan's ACF products using insulating coating conductive particles and a dual layer monopolize the world's ACF market. However, there is a need for the development of a new ACF technology for fine pitch bonding because the Japan's ACF products have many bonding errors in the fine pitch.

SUMMARY OF THE INVENTION

There are provided a method and apparatus for fabricating a film, which can uniformly disperse conductive particles within an anchoring polymer layer (APL) using a magnetic field in fabricating the APL that suppresses a movement of the conductive particles.

There are provided a method and apparatus for fabricating a film, which can uniformly disperse conductive particles within an APL using a magnetic field structure capable of maximizing a vertical direction magnetic field.

There is provided a method of fabricating a film, including forming a liquefied polymer layer by roll-to-roll coating a polymer solution in which a plurality of conductive particles has been mixed, dispersing the plurality of conductive particles included in the liquefied polymer layer by applying a magnetic field to the liquefied polymer layer, and fabricating a solid polymer layer limiting a movement of the plurality of dispersed conductive particles by drying the liquefied polymer layer in which the plurality of conductive particles has been dispersed.

In one aspect, the plurality of conductive particles may be dispersed within the liquefied polymer layer by a repulsive force occurring between the plurality of conductive particles as the plurality of conductive particles is magnetized by the magnetic field.

In another aspect, dispersing the conductive particles may include applying a vertical direction magnetic field to the liquefied polymer layer.

In yet another aspect, dispersing the conductive particles may include applying a vertical direction magnetic field to the liquefied polymer layer, using a magnetic field structure including at least one magnet and a magnetic shielding material shielding a horizontal direction magnetic field of the at least one magnet.

In yet another aspect, dispersing the conductive particles may include applying the magnetic field to at the same position of the liquefied polymer layer for a specific reference time or more.

In yet another aspect, the liquefied polymer layer may include the plurality of conductive particles as a single layer.

In yet another aspect, the method may further include fabricating an anisotropic conductive film to which an adhesive property has been assigned by laminating an adhesive layer configured with a non-conductive film (NCF) on upper and lower parts of the solid polymer layer.

In yet another aspect, the conductive particle may include a nickel-plated polymer conductive particle.

In yet another aspect, the ratio of a total number of conductive particles within a unit area of the solid polymer layer versus the number of conductive particles present as a unity may be included in a range of 55% to 80%.

There is provided a method of fabricating a film, including dispersing a plurality of conductive particles within a liquefied polymer layer, including the plurality of conductive particles, through a repulsive force between the plurality of conductive particles magnetized by a magnetic field by applying the magnetic field to the liquefied polymer layer.

There is provided a film fabrication apparatus, including a roll coater configured to form a liquefied polymer layer by roll-to-roll coating a polymer solution in which a plurality of conductive particles has been mixed, a magnetic field structure configured to disperse the plurality of conductive particles included in the liquefied polymer layer by applying a magnetic field to the liquefied polymer layer passing through the roll coater, and a dry unit configured to fabricate a solid polymer layer limiting a movement of the plurality of dispersed conductive particles by drying the liquefied polymer layer in which the plurality of conductive particles has been dispersed.

DETAILED DESCRIPTION

Figure 1:
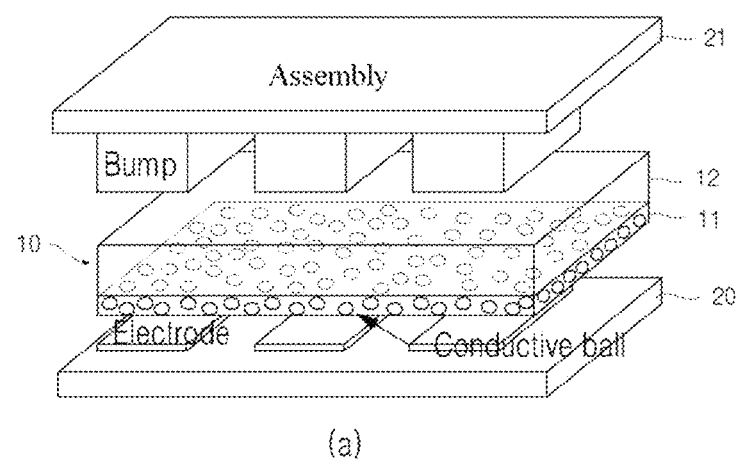
FIG. 1 illustrates a conventional ACF for electrical bonding having two electrodes.
Figure 1:
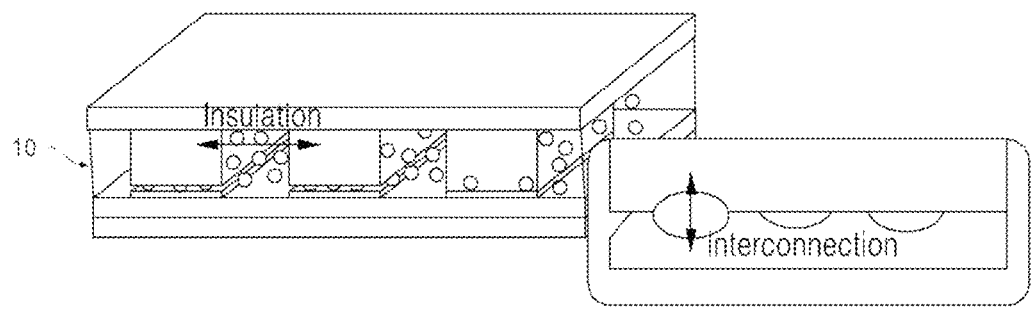
Figure 2:
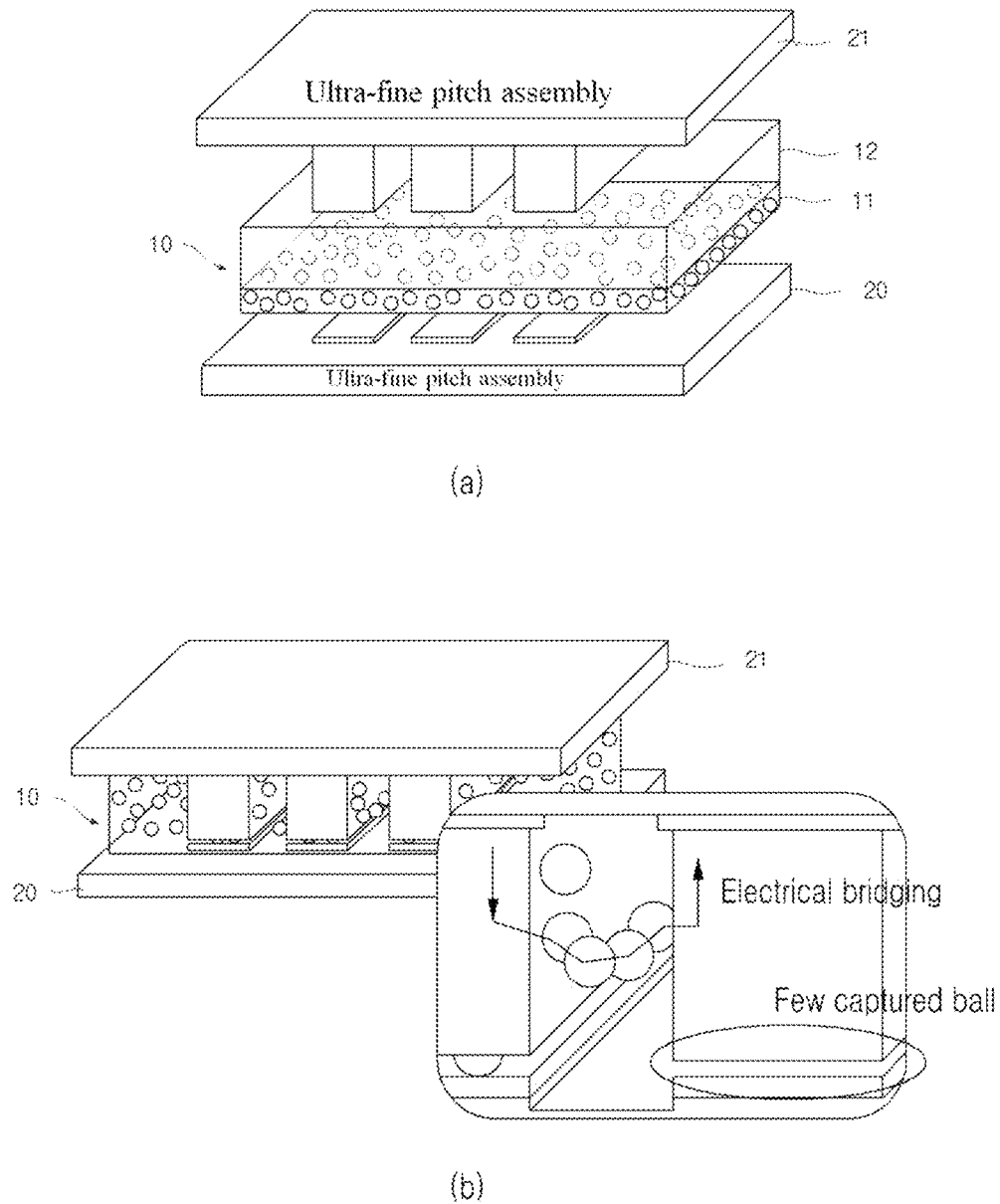
FIG. 2 illustrates an electrical short phenomenon and unstable contact state occurring in conventional ultra-fine pitch bonding.

Hereinafter, embodiments are described with reference to the accompanying drawings. However, the described embodiments may be modified in various other forms, and the scope of the present invention is not restricted by the following embodiments. Furthermore, several embodiments are provided to fully describe the present invention to a person having ordinary knowledge in the art to which the present invention pertains. The shapes, sizes, etc. of elements in the drawings may be exaggerated for a clear description The following embodiments can secure an excellent electrical bonding characteristic by providing a new anisotropic conductive film(s) (ACF(s)) including an anchoring polymer layer (APL) that suppresses a flow of conductive particles. In this case, the APL may mean a polymer layer that limits a movement of conductive particles. A new ACF including the APL may be represented as an anisotropic conductive film including a polymer layer that limits a movement of conductive particles (which may be simply referred to as an "APL ACF(s)"). The APL ACF including a polymer layer that limits a movement of conductive particles may be formed by a method of dispersing conductive particles into an APL having excellent tensile strength and laminating or dually coating a polymer adhesive layer of a non-conductive film (NCF), that is, an insulating film on the upper and lower parts of the conductive particle.

A flow of conductive particles can be certainly reduced although a flow of resin occurs by connecting the conductive particles using a polymer having strong tensile stress because an APL ACF including a polymer layer that limits a movement of conductive particles is used.

Furthermore, there are further provided embodiments for a new method capable of self-exposing a surface of a conductive particle without the introduction of a separate process for removing a polymer skin that surrounds the conductive particle.

Figure 3:
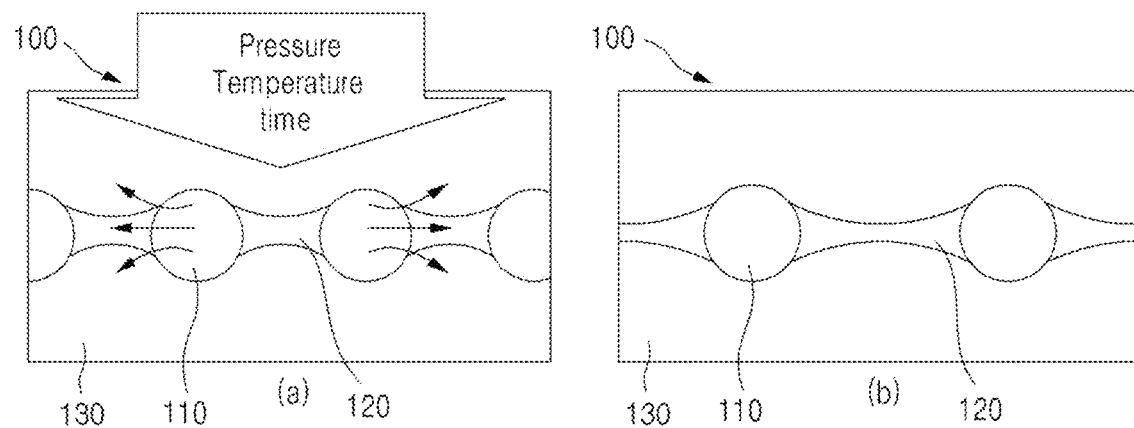
FIG. 3 illustrates movements of conductive particle and a polymer layer that limits a movement of conductive particles according to one embodiment.

FIG. 3 illustrates movements of conductive particle and a polymer layer that limits a movement of conductive particles according to one embodiment.

FIG. 3a shows a movement of conductive particles in the bonding process of an APL ACF according to one embodiment. FIG. 3b shows the state of a polymer layer that limits a movement of conductive particles after the bonding process of the APL ACF according to one embodiment.

An APL ACF 100 according to one embodiment is described in detail with reference to FIG. 3. In this case, a polymer layer 120 that limits a movement of conductive particles may be the above-described APL.

The APL ACF 100 including a plurality of conductive particles according to one embodiment may be configured with the polymer layer 120 and an adhesive layer 130.

A plurality of conductive particles 110 has been dispersed into the polymer layer 120, and may limit a movement of the plurality of dispersed conductive particles 110 by capturing the particles.

The polymer layer 120 may be made of a polymer having tensile stress, which limits a flow of the plurality of conductive particles 110 when a flow of resin occurs due to a bonding process by connecting the plurality of conductive particles 110.

In this case, the polymer layer 120 may be made of a thermoplastic polymer not having an adhesive property, and has a wide selection of materials because any thermoplastic polymer having tensile stress that limits a flow of the plurality of conductive particles 110 when a flow of resin occurs due to a bonding process can be used.

For example, materials shown in Table 1 may be used as the polymer layer 120.

TABLE 1

| No. | APL polymer | Polymer solution |
| --- | --- | --- |
| 1 | Polybutadiene succinate (PBS) | Chloroform + N,N-Dimethylmethanamide |
| 2 | Polyvinyl fluoride (PVDF) | Acetone + Dimethylacetamide |
| 3 | Nylon 666 | Chloroform + Formic acid |
| 4 | Nylon 66 | |
| 5 | Nylon 6 | |
| 6 | Nylon 12 | |
| 7 | Polyacrylonitrile (PAN) | N,N-Dimethylmethanamide |

A polymer skin layer that surrounds the upper and lower parts of the plurality of dispersed conductive particles 110 within the polymer layer 120 is removed, and thus the conductive particle may connect an upper electrode and a lower electrode to form electrical bonding.

For example, the polymer skin layer of the polymer layer 120 that surrounds the upper and lower parts of the plurality of conductive particles 110 may be removed through vertical direction ultrasonic bonding, thereby forming electrical bonding between an upper electrode and a lower electrode.

The polymer layer 120 may be fabricated through roll-to-roll coating after the plurality of conductive particles 110 is dispersed into a polymer solution through mixing.

The adhesive layer 130 is configured in the upper and lower parts of the polymer layer 120 not having an adhesive property, and may assign an adhesive property.

The adhesive layer may be formed by laminating or dually coating a polymer adhesive layer of an NCF on the upper and lower parts of the polymer layer 120. For example, the adhesive layer may be configured with acrylic resin, cationic epoxy resin, anionic epoxy resin, etc.

As described above, in the ACF including the plurality of conductive particles 110 according to one embodiment, the polymer layer 120 suppresses a flow of the plurality of conductive particles 110, and a high capture ratio is implemented using a small amount of initial conductive particles. Accordingly, electrical bonding is made possible in a fine pitch or ultra-fine pitch in which the interval between electrodes becomes fine.

Figure 4:
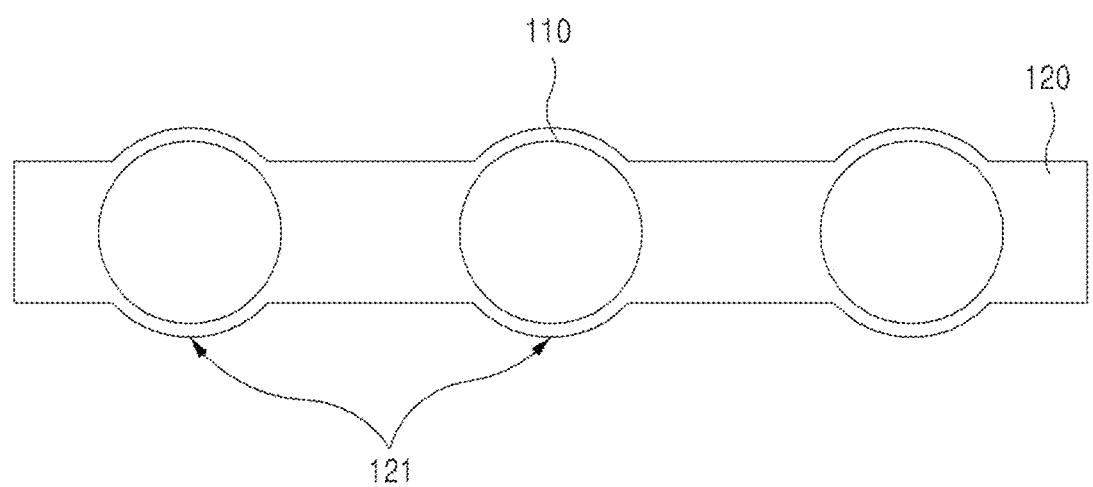
FIG. 4 illustrates a polymer layer that limits a movement of conductive particles from which a polymer skin has not been removed according to one embodiment.

FIG. 4 illustrates a polymer layer that limits a movement of conductive particles from which a polymer skin has not been removed according to one embodiment.

As shown in FIG. 4, while the polymer layer 120 that limits a movement of conductive particles is fabricated, the polymer of the polymer layer 120 that limits a movement of conductive particles surrounds the upper and lower parts of the conductive particles within the polymer layer 120 that limits a movement of conductive particles. This may be called a polymer skin layer 121. In the state in which the polymer skin layer 121 has not been removed, if the conductive particles of the polymer layer 120 that limits a movement of conductive particles between electrodes is pressed, a stable electrical bonding in the vertical direction is hindered because the polymer skin layer 121 functions as an insulating layer.

Accordingly, a stable electrical bonding characteristic may appear after a bonding process only when the polymer skin layer 121 that surrounds the conductive particles within the polymer layer is removed. Accordingly, a surface of the conductive particle needs to be exposed in order to implement an excellent electrical bonding characteristic of an APL ACF.

In order to expose a surface of the conductive particle by removing the polymer skin layer 121, a high-temperature bonding process may be performed at a temperature higher than the melting point of a polymer that forms the polymer layer 120 or an additional process, such as a plasma etching process or an ultrasonic wave process, needs to be performed. In this case, a stable electrical bonding may be obtained through self-exposure for a surface of the conductive particle without the high-temperature bonding process or an additional process. Embodiments of such self-exposure are described more specifically later.

Figure 5:
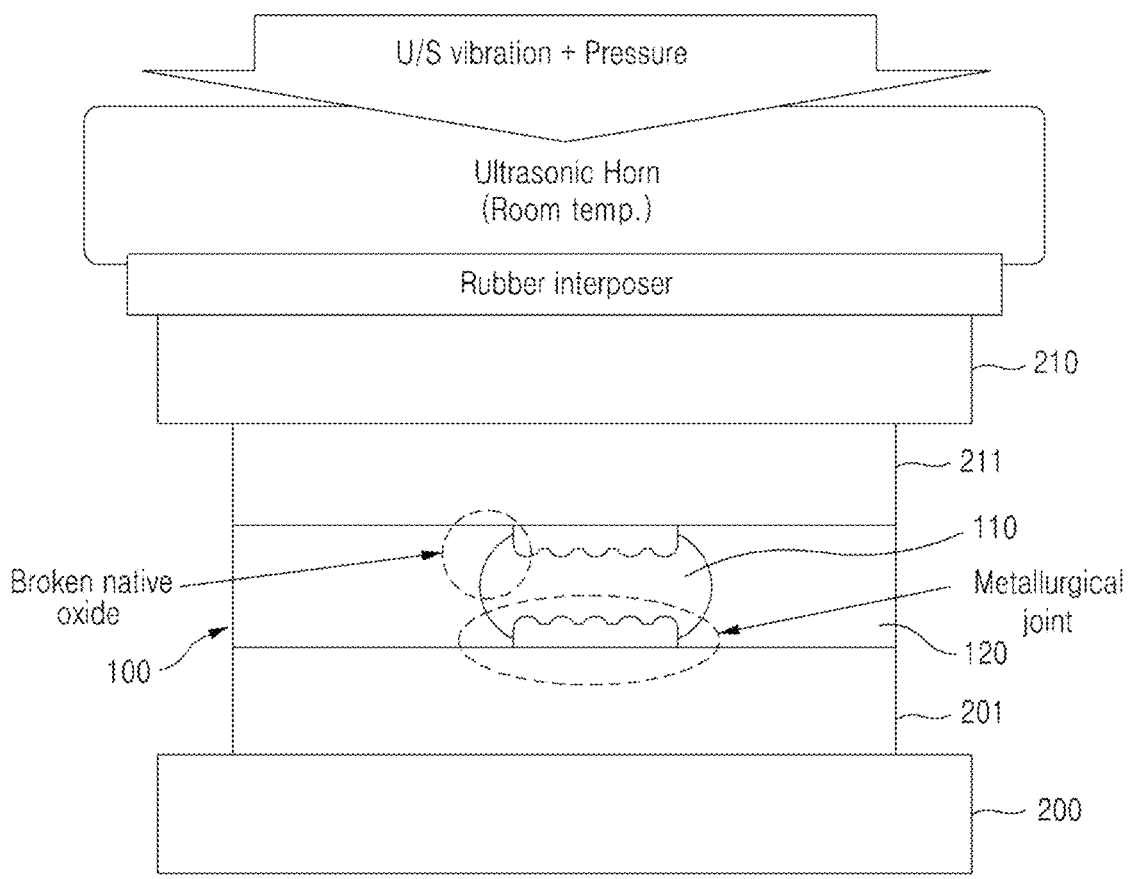
FIG. 5 illustrates the structure of a stable bonding state using a conductive particle between two electrodes according to one embodiment.

FIG. 5 illustrates the structure of a stable bonding state using a conductive particle between two electrodes according to one embodiment.

FIG. 5 shows an example of a structure for a stable bonding state using a conductive particle between two electrodes. A thin polymer skin layer surrounding the conductive particle 110 may be removed using ultrasonic waves, etc. For example, after the polymer skin layer of the conductive particle 110 is removed through vertical direction ultrasonic bonding, stable bonding may be performed using the conductive particle 110 between the two electrodes.

The structure for the stable bonding state using the conductive particle between the two electrodes according to one embodiment may include the APL ACF 100 according to one embodiment described with reference to FIGS. 3 and 4.

In the structure including the APL ACF 100 according to one embodiment, the APL ACF 100 may be positioned between an upper substrate 210 and a lower substrate 200, and an ultrasonic (U/S) method may be used or heat and pressure may be applied so that electrical bonding is achieved through a plurality of the conductive particles 110 between the electrodes, each one having several tens of μm in thickness on the upper and lower sides.

An upper electrode 211 may be formed under the upper substrate 210. For example, the upper substrate 210 may be configured with a flexible printed circuit board (FPCB) or may be configured with a printed circuit board (PCB), but is not limited thereto.

Furthermore, a lower electrode 201 may be formed over the lower substrate 200. For example, the lower substrate 200 may be configured with a PCB or may be configured with an FPCB, but is not limited thereto.

In this case, each of the upper substrate 210 and the lower substrate 200 may be configured with a fine-pitched or ultra-fine pitched substrate as the size of an electronic device is reduced.

The APL ACF 100 is compressed between the upper substrate 210 and the lower substrate 200, and may include the polymer layer 120 in which the plurality of conductive particles 110 is disposed. In this case, polymer skin layers that surround the upper and lower parts of the plurality of dispersed conductive particles 110 within the polymer layer 120 may be removed, and thus the upper electrode 211 of the upper substrate 210 and the lower electrode 201 of the lower substrate 200 may be connected by the conductive particles 110, thereby forming electrical bonding.

More specifically, the APL ACF 100 may include the polymer layer 120 and an adhesive layer. The polymer layer 120 has the plurality of conductive particles 110 dispersed therein, and may limit a movement of the plurality of dispersed conductive particles 110 by capturing them. In this case, the polymer skin layers that surround the upper and lower parts of the plurality of dispersed conductive particles 110 within the polymer layer 120 may be removed, and thus the upper electrode 211 and the lower electrode 201 may be connected by the conductive particle 110, thereby forming electrical bonding. For example, the polymer skin layers of the polymer layer 120, which surround the upper and lower parts of the plurality of dispersed conductive particles 110, may be removed through vertical direction ultrasonic bonding, so electrical bonding may be formed between the upper electrode 211 and the lower electrode 201.

Accordingly, stable electrical bonding can be performed because the polymer skin layer surrounding the conductive particle is effectively removed through vertical direction ultrasonic bonding. Furthermore, a flow of the conductive particles 110 is suppressed using the polymer layer 120 that limits a movement of conductive particles, and a high capture ratio of the conductive particles 110 is implemented although a small amount of initial conductive particles 110 is used. Accordingly, price competitiveness can be secured because fine pitch bonding is made possible using a cheap APL ACF 100.

Figure 6:
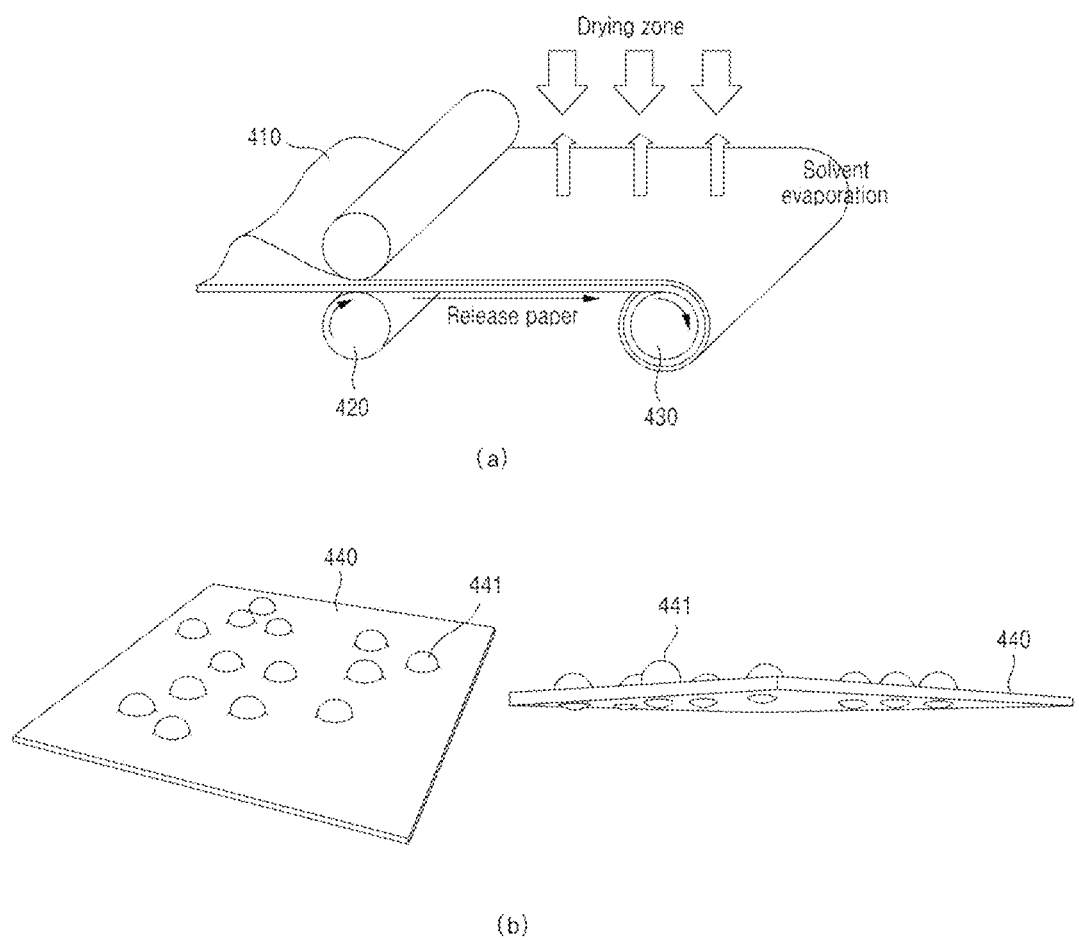
FIG. 6 illustrates an example of a process of fabricating a polymer layer that limits a movement of conductive particles according to one embodiment.

FIG. 6 illustrates an example of a process of fabricating a polymer layer that limits a movement of conductive particles according to one embodiment.

Referring to FIG. 6a, the polymer layer that limits a movement of conductive particles may be easily fabricated by dispersing conductive particles into a solution 410 in which the conductive particles and a polymer solution are mixed and then performing a roll-to-roll coating method. In this case, calender rolls 420 may be used to dry the mixed solution 410 by passing the solution 410 between the calendar rolls, or release paper for moving the solution may be used. Furthermore, a receiving roll 430 for moving the solution may be used.

Accordingly, a polymer layer 440 that limits a movement of conductive particles may be formed as shown in FIG. 6b. The polymer layer 440 may have a plurality of conductive particles 441 dispersed therein, and may fix the conductive particles by limiting a movement of the conductive particles although polymer resin moves.

In order to use the polymer layer 440 for display applications, an adhesive property needs to be assigned to the polymer layer 440 because the polymer layer is a thermoplastic polymer not having an adhesive property. Accordingly, the adhesive property may be assigned by configuring an adhesive layer on the upper and lower parts of the polymer layer 440.

Figure 7:
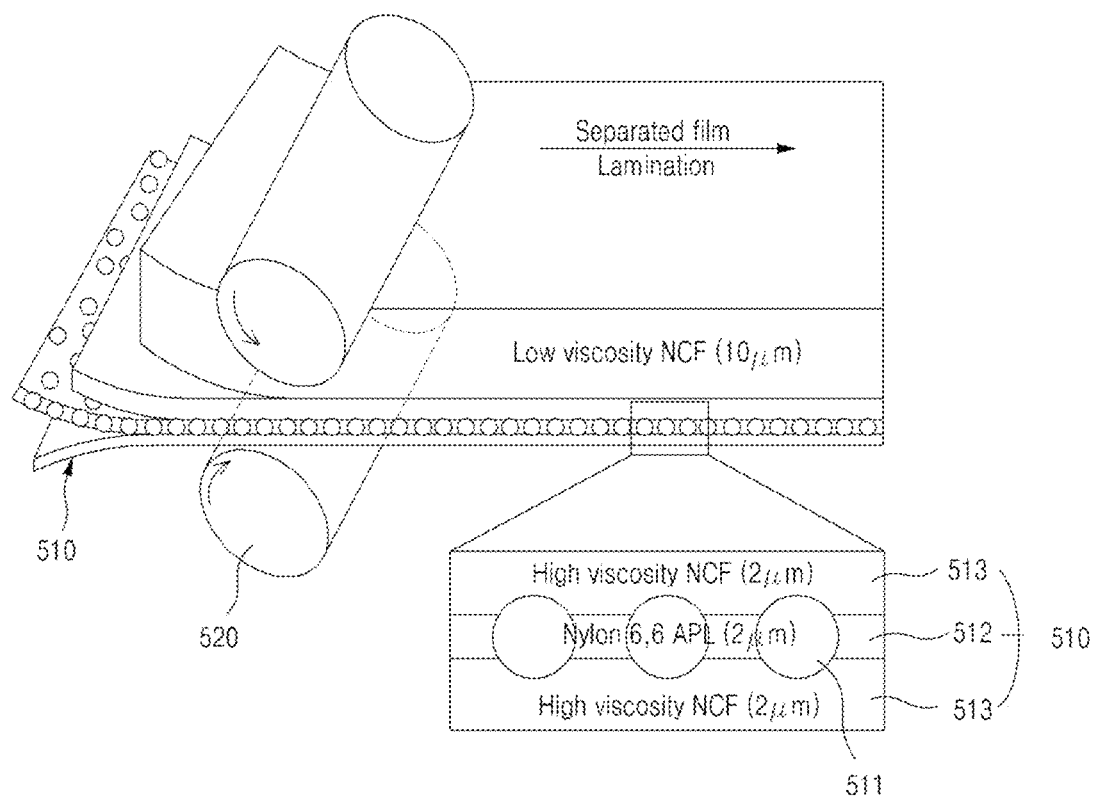
FIG. 7 shows a method of fabricating an anisotropic conductive film (ACF) including a polymer layer that limits a movement of conductive particles according to one embodiment.

FIG. 7 shows a method of fabricating an APL ACF according to one embodiment.

Referring to FIG. 7, in the method of fabricating an APL ACF 510 according to one embodiment, after a polymer solution and a plurality of conductive particles 511 are mixed and dispersed, a polymer layer 512 that limits a movement of conductive particles may be fabricated by performing roll-to-roll coating on a polymer solution with which the plurality of conductive particles 511 has been mixed.

Furthermore, an adhesive property may be assigned to the polymer layer 512 by laminating an adhesive layer 513, made of a non-conductive film (NCF), on the upper and lower parts of the polymer layer 512.

Furthermore, the polymer skin layers of the polymer layer 512, surrounding the upper and lower parts of the plurality of conductive particles 511 disposed within the polymer layer 512, may be removed, and thus an upper electrode and an lower electrode may be directly connected by the plurality of conductive particles 511, thereby forming electrical bonding.

Figure 8:
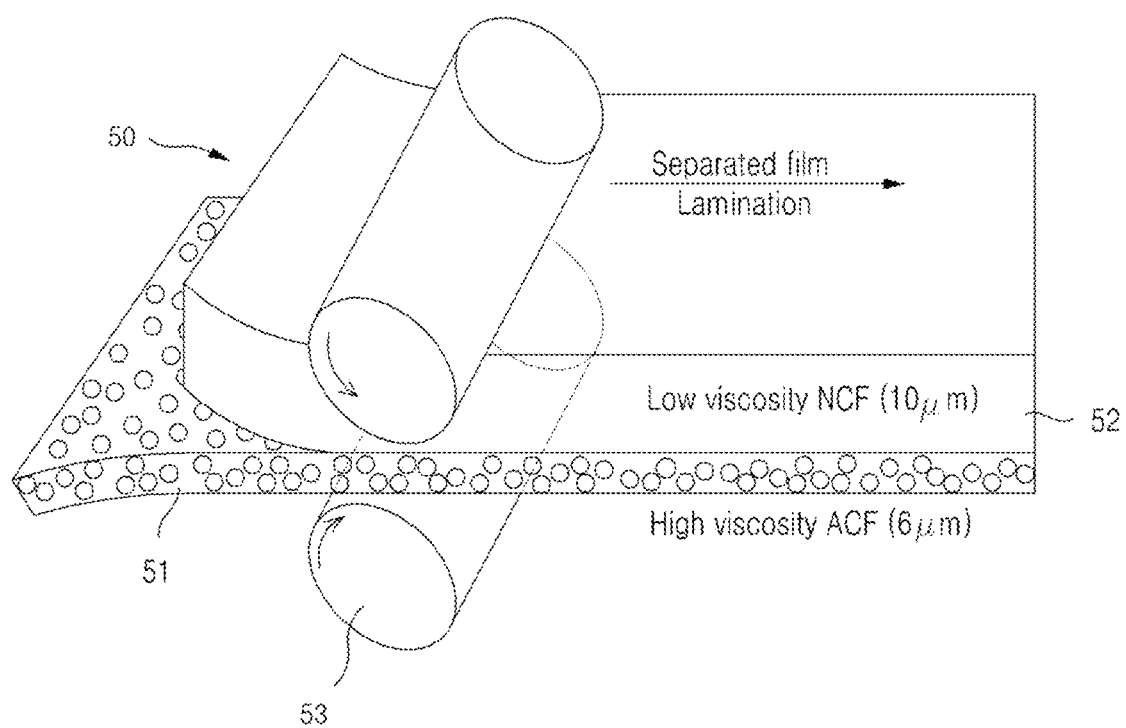
FIG. 8 shows a conventional process of fabricating an ACF.

FIG. 8 shows a conventional process of fabricating an ACF.

A process of fabricating the APL ACF 510 according to one embodiment and a conventional process of fabricating an ACF may be compared with reference to FIGS. 7 and 8.

The process of fabricating the APL ACF 510 according to one embodiment may be simply performed through a process of laminating an adhesive layer 513, that is, an NCF not containing a conductive particle, using a roll laminator 520, which is the same as or similar to a conventional common process of fabricating an ACF 50.

As shown in FIG. 8, in the case of the conventional ACF 50, in a lamination process using a polymer layer 51 including conductive particles and the roll laminator 53 of an NCF 52, a flow of conductive particles may occur because a resin flow of the NCF 52 occurs according to electrical bonding.

In contrast, as shown in FIG. 7, in the APL ACF 510 according to one embodiment, when electrical bonding is performed using the ACF 510 including the polymer layer 512 to which an adhesive property has been assigned and that limits a movement of conductive particles, a flow of the conductive particles 511 rarely occurs regardless of a resin flow of the adhesive layer 513, that is, an NCF, because the conductive particles 511 are captured by the polymer layer 512 due to the process of laminating the adhesive layer 513, that is, an NCF. Accordingly, a movement of the conductive particles 511 can be suppressed before and after bonding.

Figure 9:
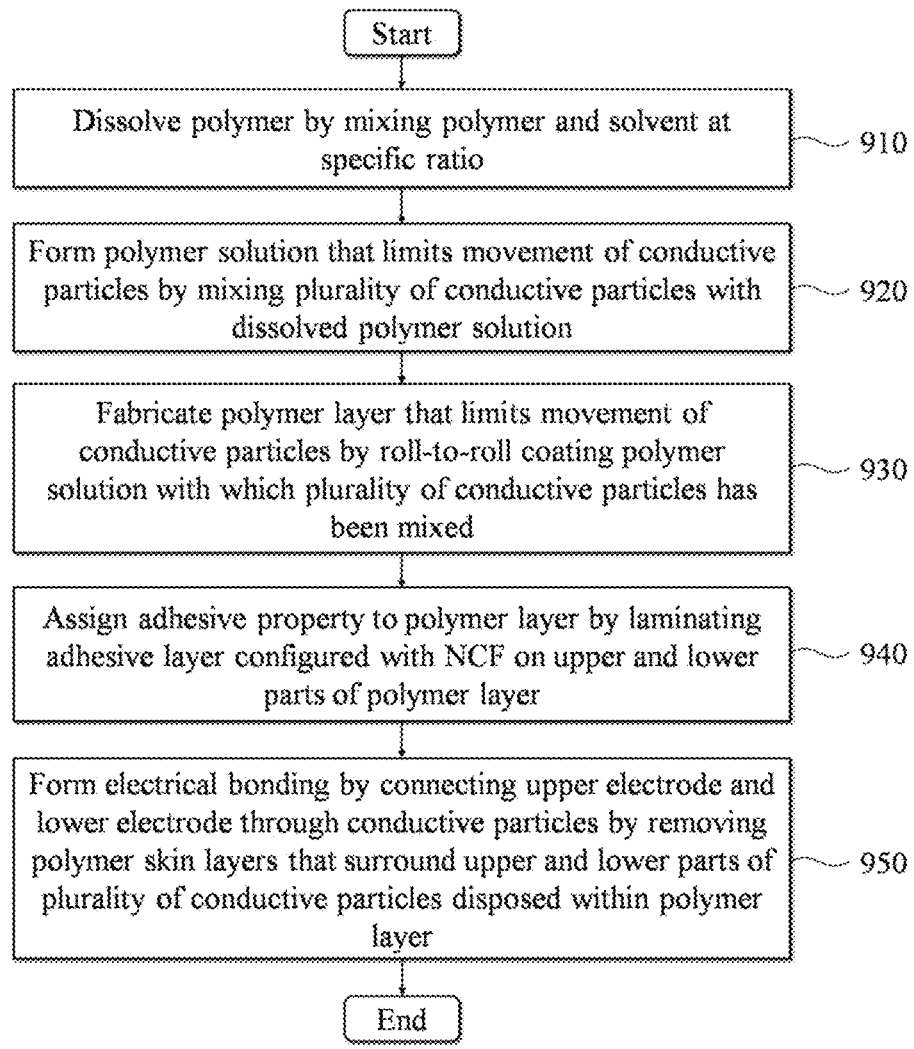
FIG. 9 is a flowchart showing an example of a method of fabricating an ACF including a polymer layer that limits a movement of conductive particles according to one embodiment.

FIG. 9 is a flowchart showing an example of a method of fabricating an ACF including a polymer layer that limits a movement of conductive particles according to one embodiment.

Referring to FIG. 9, the method of fabricating an APL ACF according to one embodiment includes the steps of dissolving a polymer by mixing the polymer and a solvent at a specific ratio (910), forming a polymer solution that limits a movement of conductive particles by mixing a plurality of conductive particles with the dissolved polymer solution (920), and fabricating a polymer layer that limits a movement of conductive particles by roll-to-roll coating the polymer solution with which the plurality of conductive particles has been mixed (930).

Furthermore, the method may further include the step 940 of assigning an adhesive property to the polymer layer by laminating an adhesive layer, configured with an NCF, on the upper and lower parts of the polymer layer.

Furthermore, the method may further include the step 950 of forming electrical bonding by connecting an upper electrode and a lower electrode through the conductive particles by removing the polymer skin layers that surround the upper and lower parts of the plurality of conductive particles disposed within the polymer layer.

In this case, the polymer layer can limit a movement of the plurality of conductive particles by capturing the conductive particles when a flow of resin occurs due to the bonding process.

Each of the steps of the method of fabricating an APL ACF according to one embodiment is described more specifically below, as an example.

The method of fabricating an APL ACF according to one embodiment may be used to fabricate the APL ACF described with reference to FIGS. 3 to 7, and may be implemented by a system for fabricating an ACF, for example.

At step 910, the polymer may be dissolved by mixing the polymer and the solvent at a given ratio. In this case, content of the polymer is 7 wt % or more. If content of the polymer is less than 7 wt %, a film is not formed in a dry process, that is, one of processes of forming the film.

At step 920, the polymer solution that limits a movement of conductive particles may be formed by mixing the plurality of conductive particles with the dissolved polymer solution. In this case, the plurality of conductive particles may be dispersed into the polymer solution with which the plurality of conductive particles has been mixed.

At step 930, the polymer layer that limits a movement of conductive particles may be fabricated by roll-to-roll coating the polymer solution with which the plurality of conductive particles has been mixed and that limits a movement of conductive particles. In this case, the polymer layer may limit a movement of the plurality of conductive particles by capturing the conductive particles when a flow of resin occurs due to the bonding process.

More specifically, after the polymer solution that limits a movement of conductive particles, with which the plurality of conductive particles has been mixed, is injected into the entry of a roll-to-roll film coater, the polymer solution may pass through a narrow gap between the two rolls by rotating the rolls at given speed. Thereafter, the polymer layer that limits a movement of conductive particles may be fabricated because the solvent evaporates through a dry section. The polymer layer may be made of a polymer having tensile stress, which limits a flow of the plurality of conductive particles when a flow of resin occurs due to the bonding process, because the plurality of conductive particles is connected by the polymer layer.

Furthermore, the plurality of conductive particles may be configured with solders or conductive particles including solders. The plurality of conductive particles configured with solders or conductive particles including solders may be disposed in the polymer layer, and thus the polymer layer may limit a movement of the plurality of conductive particles by capturing the conductive particles when a flow of resin occurs due to the bonding process.

At step 940, after the polymer layer that limits a movement of conductive particles is fabricated, an adhesive property may be assigned to the polymer layer by laminating the adhesive layer formed of an NCF on the upper and lower parts of the polymer layer.

At step 950, the polymer skin layers of the polymer layer that surround the upper and lower parts of the plurality of conductive particles disposed within the polymer layer are removed, and thus the upper electrode and the lower electrode are connected by the conductive particles, thereby forming electrical bonding.

In this case, the polymer skin layers of the polymer layer surrounding the upper and lower parts of the plurality of conductive particles may be removed through a vertical direction ultrasonic bonding process.

According to embodiments, when a bonding process is performed on an ACF using an APL containing metallic conductive particles and an ACF including a polymer layer that limits a movement of conductive particles based on various thermoplastic polymers, excellent electrical bonding can be achieved by removing polymer skin layers surrounding conductive particles using vertical direction ultrasonic waves.

This enables simultaneous bonding while exposing the conductive particles from the polymer because vertical direction ultrasonic waves are generated during the bonding process, compared to the existing expensive plasma etching method for exposing conductive particles surrounded by the polymer.

The ACF including the polymer layer that fundamentally suppresses a movement of conductive particles has a new structure quite different from a conventional ACF. The role of suppressing a movement of conductive particles is not limited to an expensive nano-fiber, and a movement of conductive particle can be further suppressed without a limit to a material, form and fabrication method.

Furthermore, the selection of a polymer material used is widened, and a cheap process is made possible through vertical direction ultrasonic waves generated during a bonding process without the intervention of an expensive plasma etching process.

A display having an ultra-fine pitch assembly continues to be mounted and used for home appliances and IT devices for industry, such as TV, notebooks, mobile phones, game machines and ATMs, and is an industry field having a great ripple effect in the entire industry. An ACF that must be used for the display and semiconductor packaging products continues to grow and is expanded to other fields. An APL ACF product may be widely applied to the chip-on glass (COG), chip-on flex (COF), and chip-on packaging (COP) of large/medium and small liquid crystal display (LCD)/organic light emitting diode (OLED) flat displays having an ultra-fine pitch. Furthermore, if the type of conductive particle is changed, the APL ACF product may be applied to a CCD-CMOS camera module bonding field for increasing the number of pixels of a camera having high picture quality and an OLED display for virtual reality (VR) that requires picture quality of UHD or more. Furthermore, an APL ACF having guaranteed reliability may be applied to wearable electronic devices.

Particularly, the ACF market has a continued growth rate of 5~6% since 2010 as the demand for electronic devices, such as large size TV, notebooks and smartphones, increases and the demand for the ACF in medium and small displays, such as game machines, vehicle navigators and vehicles, increases. However, the ACF experiences severe downward pressure on its unit cost due to materials used in a display part. Accordingly, the ACF has an economic entry barrier in volume because an ACF growth width is small although the final display demand is increased.

Embodiments may solve electrical short and high contact resistance problems, which may occur in ultra-fine pitch applications, by suppressing a movement of conductive particles to a maximum extent using a high strength thin polymer film. This is a technology quite different from the existing Japan's ACF for a fine pitch, and may be said to be an original patent technology advanced from the existing Japanese patent.

Figure 10:
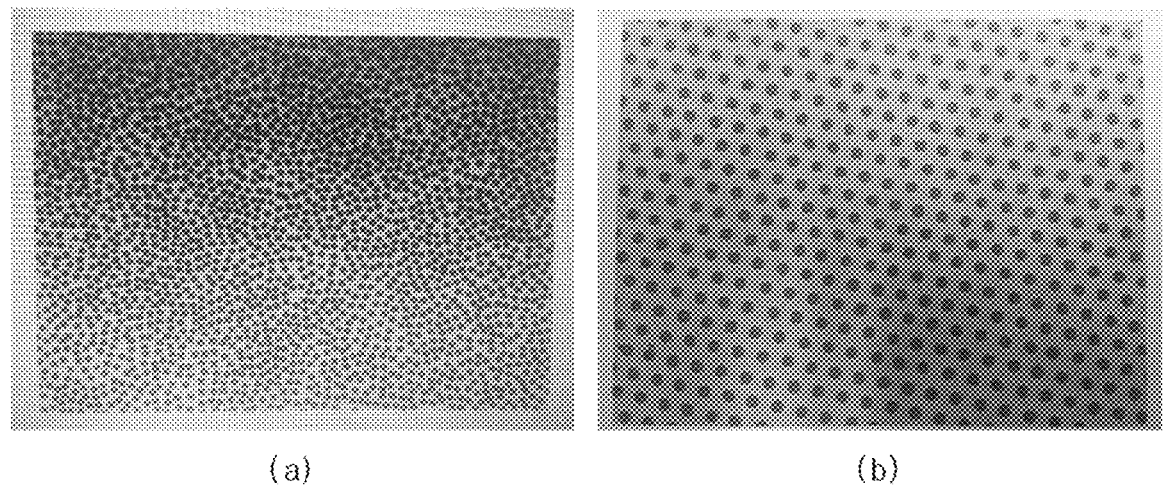
FIG. 10 illustrates an ACF to which it is difficult to apply a conventional roll-to-roll system.

FIG. 10 illustrates an ACF to which it is difficult to apply a conventional roll-to-roll system.

For example, Hitachi Chemical and Dexerials which monopolize the current ACF market do not implement a system for suppressing a flow of conductive particles and preventing the cohesion of conductive particles using a specific structure, such as an anchoring polymer layer (APL). Hitachi Chemical focuses on the ultra distribution of conductive particles as shown in FIG. 10a, and Dexerials focuses on the array of conductive particles as shown in FIG. 10b. However, the two companies experience a difficulty in mass production because it is difficult to apply them to the roll-to-roll system.

In contrast, the APL ACF according to the present embodiment may be fabricated by a simple process using the roll-to-roll system. The lamination join with the NCF formed on the upper and lower parts may be performed using the roll laminator widely used in the existing industry. Accordingly, the APL ACF according to the present embodiment has innovation that it can be easily grafted onto mass production, and can lots of costs in equipment setup and process optimization process. Accordingly, the high-performance and cheap APL ACF can be provided to local electronic material companies to provide a new growth engine. Furthermore, it is expected that this may lead to the decline of the market share monopolized by Hitachi Chemical and Dexerials.

As described with reference with FIGS. 6 and 7, the APL ACF(s) can be easily fabricated through the mixing of nickel-plated conductive particles and a polymer solution, a physical distribution of conductive particles within a solution using ultrasonic waves, and the roll-to-roll coating method. The APL film may be a thermoplastic polymer not having an adhesive property, and an adhesive property must be assigned to the APL film in order to be used for display applications. To this end, as described above, an adhesive property may be assigned to the APL film by roll-laminating an NCF, not containing conductive particles, on the upper and lower parts of the APL film. Furthermore, when bonding is performed using an ACF to which an adhesive property has been assigned, a flow of conductive particles may occur due to a resin flow of an NCF. However, conductive particles captured in the APL structure rarely flows regardless of the resin flow, thereby being capable of suppressing a movement of the conductive particles before and after bonding.

The ACF has achieved a 100% insulating characteristic even in a pitch of 15 μm. However, a small amount of conductive particles in the APL film and aggregating agents in which 2 to 3 conductive particles are aggregated may generate a high resistance deviation and an electrical short phenomenon between narrower electrodes or bumps upon electrical bonding when they are applied to a next-generation display having a pitch narrower than the pitch of 15 μm.

Hereinafter, a method of uniformly dispersing conductive particles by applying a magnetic field to a liquefied polymer film including the conductive particles on a single plane within an APL film so that the conductive particles are magnetized, and a method of fabricating an ACF using the method are described. In one embodiment, after conductive balls are uniformly dispersed by applying a vertical direction magnetic field to nickel-plated polymer conductive particles in the liquefied polymer film state, they may be solidified by drying the solvent of the polymer film. To this end, a magnetic field structure capable of condensing the magnetic field in the collection direction may be fabricated in a comma roll coater. As the liquefied APL film passes through the magnetic field, the conductive particles within the APL film may be uniformly dispersed. A solid APL film may be fabricated by drying the solvent in which the conductive particles have been uniformly dispersed. As a result, an ACF capable of stable electrical bonding in an ultra-fine pitch can be fabricated and supplied at a low price through a uniform distribution of conductive particles within the APL film.

Figure 11:
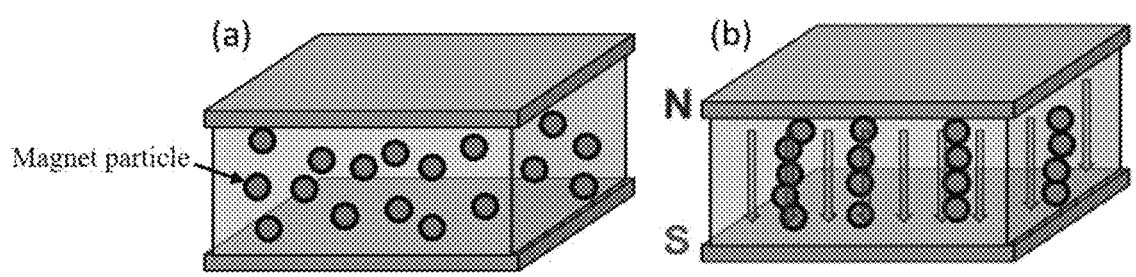
FIG. 11 illustrates the principle of a magnetorheological fluid in an embodiment of the present invention.

FIG. 11 illustrates the principle of a magnetorheological fluid (MRF) in an embodiment of the present invention. A method of distributing an aggregating agent of conductive particles using a magnetic field may be based on the principle of the MRF. The MRF is a solution including a non-conductive solvent and magnetizable particles of a micro size. It is assumed that the solution does not have high resistance to a flow. In this case, when a magnetic field is not applied to a corresponding solution, particles may be randomly distributed as shown in FIG. 11a. However, when a magnetic field is applied, the particles are magnetized and arrayed in the direction parallel to the magnetic field, and thus the solution has high resistance as shown in FIG. 11b. In this case, if nickel-plated conductive particles dispersed as a single layer within a polymer film are taken into consideration, the conductive particles may be dispersed horizontally within the polymer film by the magnetic field. An embodiment when a magnetic field is applied to conductive particles of a single layer is described with reference to FIG. 12.

Figure 12:
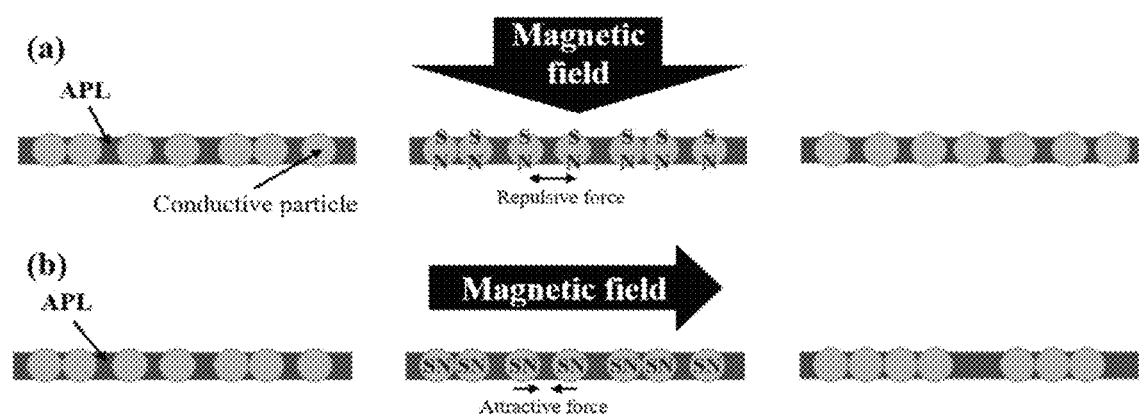
FIG. 12 shows examples in which conductive particles within an APL move in response to a magnetic field in an embodiment of the present invention.

FIG. 12 shows examples in which conductive particles within an APL move in response to a magnetic field in an embodiment of the present invention. FIG. 12a shows an example in which conductive particles within a liquefied APL may be uniformly dispersed within the liquefied APL by a repulsive force occurring by a vertical direction magnetic field. FIG. 12b shows an example in which conductive particles within a liquefied APL are agglomerated within the liquefied APL by an attractive force generated by a horizontal direction magnetic field. In other words, if the vertical direction magnetic field can be focused on the conductive particles, the conductive particles on the single plane of the liquefied APL are magnetized by the external magnetic field, and thus a repulsive force that pushes the conductive particles away from each other occurs. As a result, the conductive particles can be uniformly dispersed within the liquefied APL.

Figure 13:
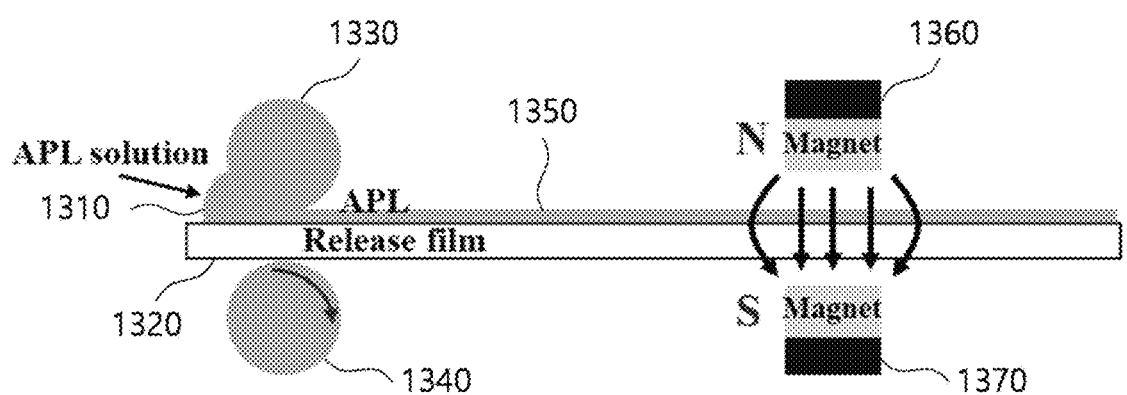
FIG. 13 shows an example of a process of fabricating an APL having a structure capable of applying a vertical direction magnetic field to conductive particles in an embodiment of the present invention.

FIG. 13 shows an example of a process of fabricating an APL having a structure capable of applying a vertical direction magnetic field to conductive particles in an embodiment of the present invention. FIG. 13 shows an example of a process of fabricating an APL film 1350 by passing a solution in which conductive particles and a polymer solution have been mixed (referred to as an "APL solution") 1310 through the gap between a first roll 1330 and a second roll 1340 on release paper 1320. In this case, the APL film 1350 passing through the gap between the first roll 1330 and the second roll 1340 may pass through magnetic field structures 1360 and 1370 capable of applying a vertical direction magnetic field. In this case, the conductive particles included in the APL film 1350 are magnetized by the vertical direction magnetic field, so a repulsive force may occur between the conductive particles. The conductive particles may be uniformly dispersed within the APL film 1350 in response to the repulsive force.

Figure 14:
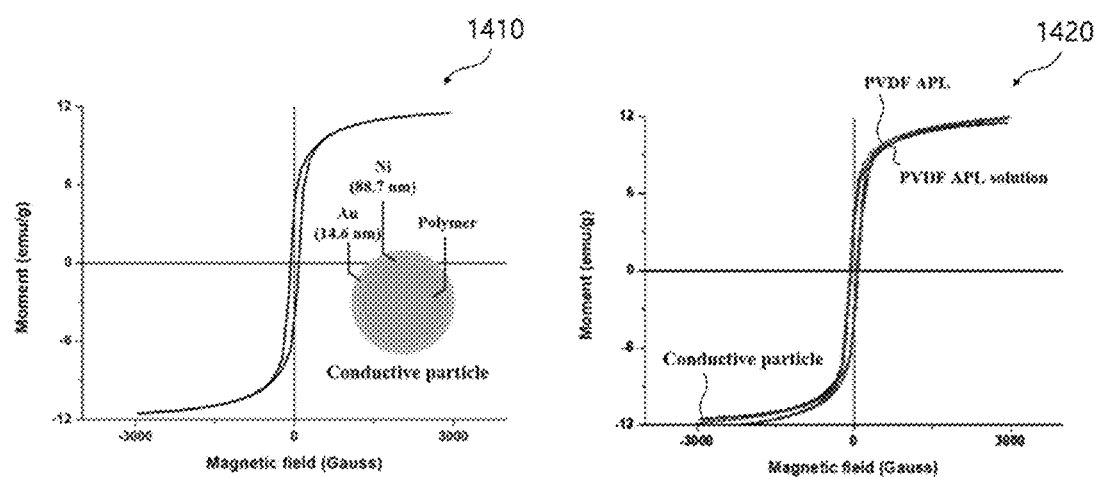
FIG. 14 show graphs of hysteresis loops of conductive particles, an APL solution and an APL film in an embodiment of the present invention.

FIG. 14 show graphs of hysteresis loops of conductive particles, an APL solution and an APL film in an embodiment of the present invention. Graphs 1410 and 1420 show examples in which hysteresis loops were measured in the state of each of conductive particles, a poly-vinylidene fluoride (PVDF) APL solution and a PVDF APL film in order to identify whether the conductive particles were magnetized by an external magnetic field and whether they were identically magnetized within the APL solution and the APL film when PVDF was used as an APL material. As a result, from a first graph 1410, it may be seen that the conductive particles are magnetized to form a loop by the external magnetic field. Furthermore, from a second graph 1420, it may be seen that the conductive particles are identically magnetized within the PVDF APL film and within the PVDF APL solution by the external magnetic field. Accordingly, it may be seen that the conductive particles continue to be subjected to the magnetic field and are magnetized until the APL solution is changed into an APL film.

Figure 15:
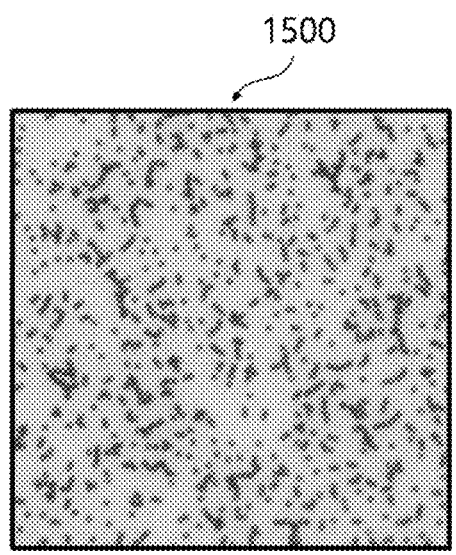
FIG. 15 shows an optical microscope image of an APL film before it is influenced by a vertical direction magnetic field in an embodiment of the present invention.
Figure 16:
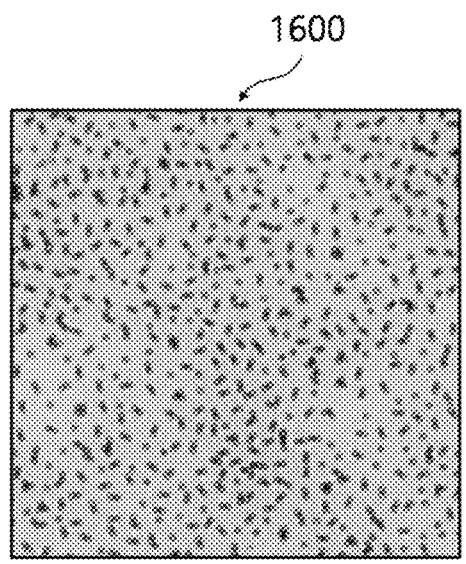
FIG. 16 shows an optical microscope image of an APL film after it is influenced by a vertical direction magnetic field in an embodiment of the present invention.

FIG. 15 shows an optical microscope image of an APL film before it is influenced by a vertical direction magnetic field in an embodiment of the present invention. FIG. 16 shows an optical microscope image of an APL film after it is influenced by a vertical direction magnetic field in an embodiment of the present invention.

In order to check whether a distribution behavior of conductive particles attributable to a vertical direction magnetic field was actually seen, a change in the distribution of conductive particles before and after the vertical direction magnetic field was applied was checked through an optical microscope. In order to apply the external magnetic field, two magnets were used as materials. In order to form the vertical direction magnetic field, different poles of the two magnets were made to face each other. A PVDF APL film was placed between the two magnets for 120 seconds.

A first image 1500 of FIG. 15 is an optical microscope image of the PVDF APL film before the vertical direction magnetic field was applied, and shows that the conductive particles were randomly dispersed to form an aggregating agent. In contrast, a second image 1600 of FIG. 16 is an optical microscope image of the PVDF APL film after the vertical direction magnetic field was applied for 120 seconds. From the second image 1600, it may be seen that an aggregating agent is still present, but the conductive particles are magnetized by the vertical direction magnetic field and thus the size of the aggregating agents is reduced and relatively uniformly dispersed to have a distribution behavior.

As the results of measurement between the two magnets using a Gauss meter, a horizontal direction magnetic field for the PVDF APL was measured to have intensity of 600 Gauss, and the vertical direction magnetic field for the PVDF APL was measured to have intensity of 1300 Gauss. From the results, it could be seen that in order to efficiently generate the distribution behavior of the conductive particles, a magnetic field structure is necessary to minimize the intensity of the horizontal direction magnetic field and to maximize the intensity of the vertical direction magnetic field. In order to fabricate such a structure, a magnetic field structure in which at least one of pure iron, nickel or aluminum chiefly used as a magnetic shielding material in the industry because the metal has high permeability was placed under the magnets was fabricated based on the principle that a magnetic shielding material having high permeability absorbs an external magnetic field and shields the magnetic field. The intensity of the magnetic field in the horizontal direction and vertical direction was measured over the magnetic shielding material of the structure.

Figure 17:
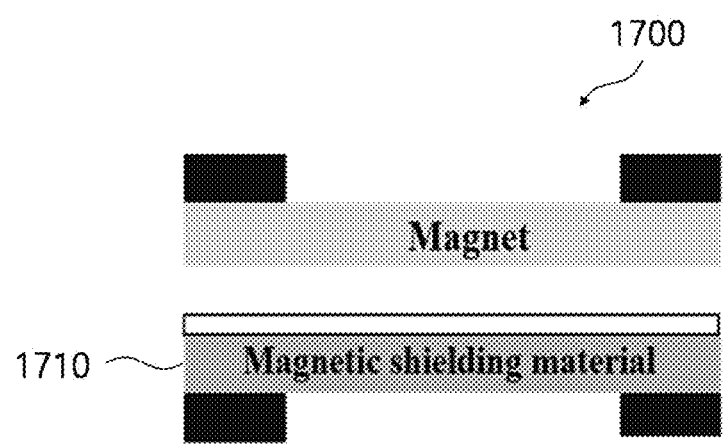
FIG. 17 shows an example of a magnetic field structure including a magnet and a magnetic shielding material in an embodiment of the present invention.
Figure 18:
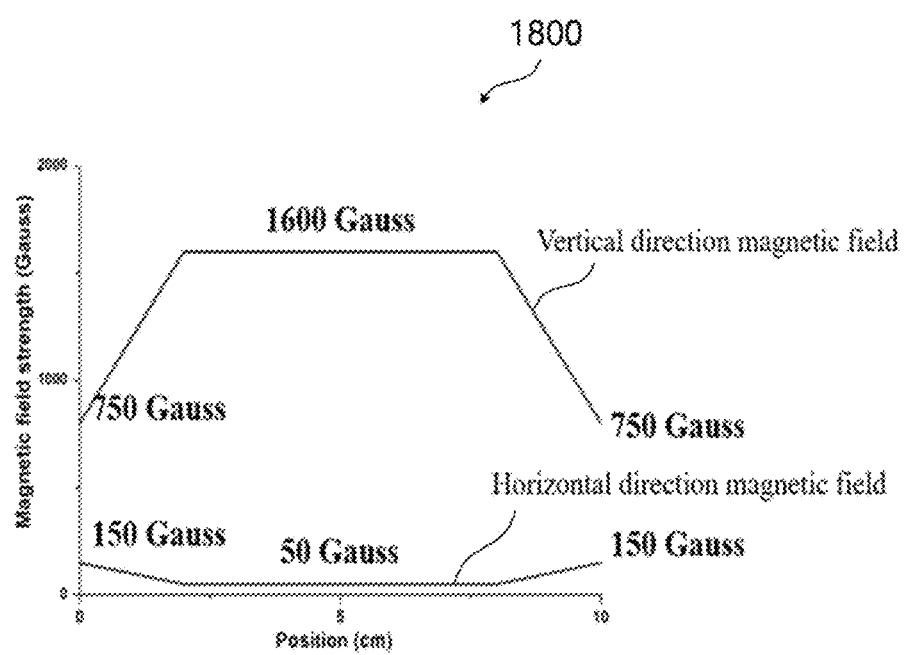
FIG. 18 is a graph showing magnetic field intensity when a magnetic field structure including a magnetic shielding material is used in an embodiment of the present invention.

FIG. 17 shows an example of a magnetic field structure including a magnet and a magnetic shielding material in an embodiment of the present invention. FIG. 18 is a graph showing magnetic field intensity when a magnetic field structure including a magnetic shielding material is used in an embodiment of the present invention. FIG. 17 shows an example of a magnetic field structure 1700 configured to include a magnetic shielding material 1710 for shielding a horizontal direction magnetic field. The magnetic field structure 1700 showed that the intensity of a horizontal direction magnetic field had a low value of 50~150 Gauss, that is, a demagnetization range of a permanent magnet, and the intensity of a vertical direction magnetic field had a high value of 750~1600 Gauss, as shown in a graph 1800 of FIG. 18. As described above, the magnetic field structure 1700 focuses on a vertical direction magnetic field by applying it to the roll-to-roll film coater, thereby being capable of maximizing a distribution behavior of conductive particles included in the APL film.

Figure 19:
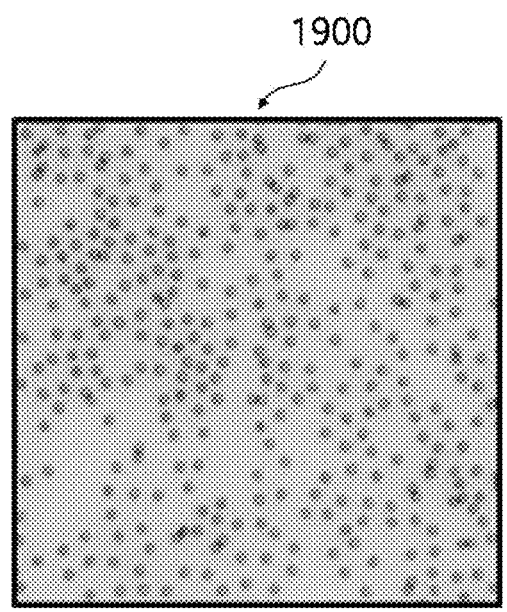
FIG. 19 shows an optical microscope image of an APL film fabricated using a magnetic field structure for focusing on a vertical direction magnetic field in an embodiment of the present invention.

FIG. 19 shows an optical microscope image of an APL film fabricated using a magnetic field structure for focusing on a vertical direction magnetic field in an embodiment of the present invention. A third image 1900 of FIG. 19 shows an example in which a distribution of the conductive particles was monitored using an optical microscope after the PVDF APL film was placed within the magnetic field structure 1700 of FIG. 17 for 120 seconds and the a vertical direction magnetic field was applied. Additionally, in order to quantitatively measure a degree of distribution of the conductive particles, the ratio of a total number of the conductive particles within a unit area versus the number of conductive particles present as a unity was defined as a distributed particle rate and quantitatively evaluated. As a result, it could be seen that conductive particles are present as a unity by the focused vertical direction magnetic field and the distributed particle rate is 80%, which is three times or more of 25%, that is, a value when the conductive particles are dispersed using a magnet structure including two magnets.

Furthermore, the time during which the PVDF APL film stayed within the magnetic field structure 1700 was made different, and a distribution of the conductive particles and the distributed particle rate were measured using an optical microscope.

Figure 20:
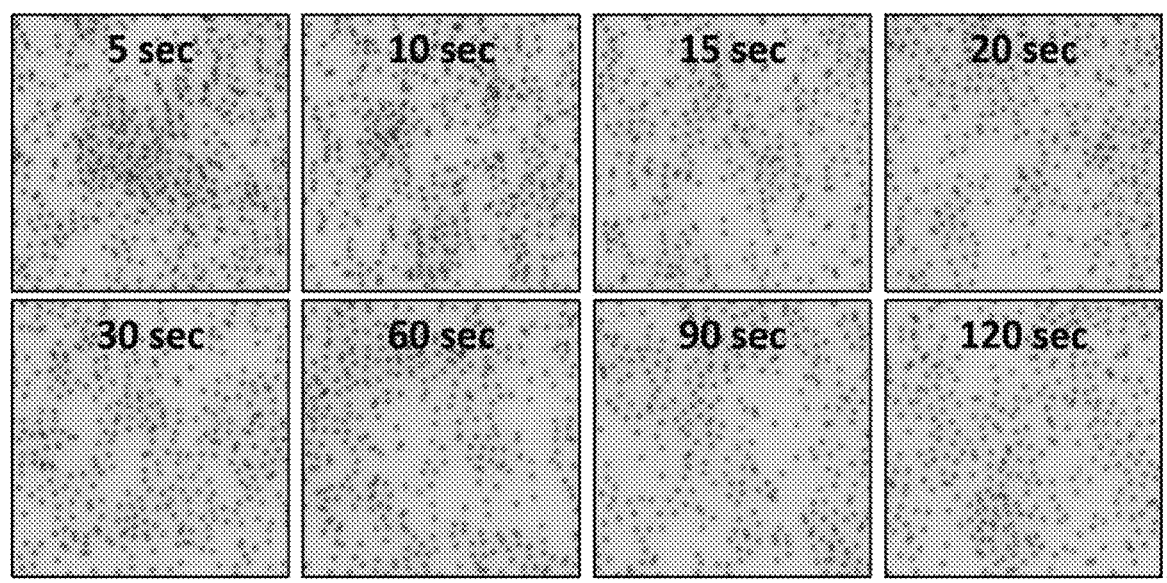
FIG. 20 shows optical microscope images of an APL film according to stay times within the magnetic field structure in an embodiment of the present invention.
Figure 21:
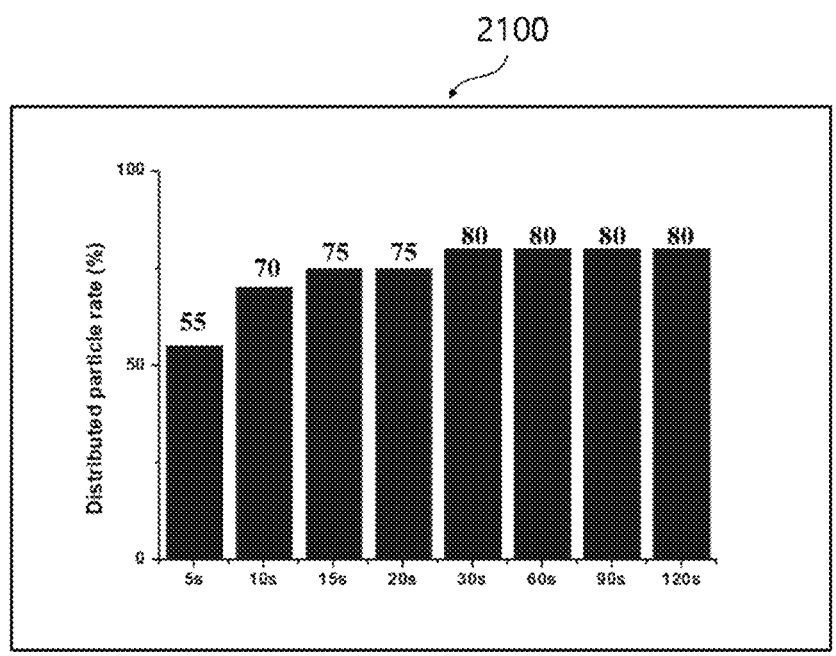
FIG. 21 is a graph showing distributed particle rates according to stay times within the magnetic field structure in an embodiment of the present invention.

FIG. 20 shows optical microscope images of an APL film according to stay times within the magnetic field structure in an embodiment of the present invention. FIG. 21 is a graph showing distributed particle rates according to stay times within the magnetic field structure in an embodiment of the present invention. From the graph 2100, it may be seen that the distributed particle rate attributable to the vertical direction magnetic field is saturated to 80% from 30 seconds in the PVDF APL film within the magnetic field structure.

Figure 22:
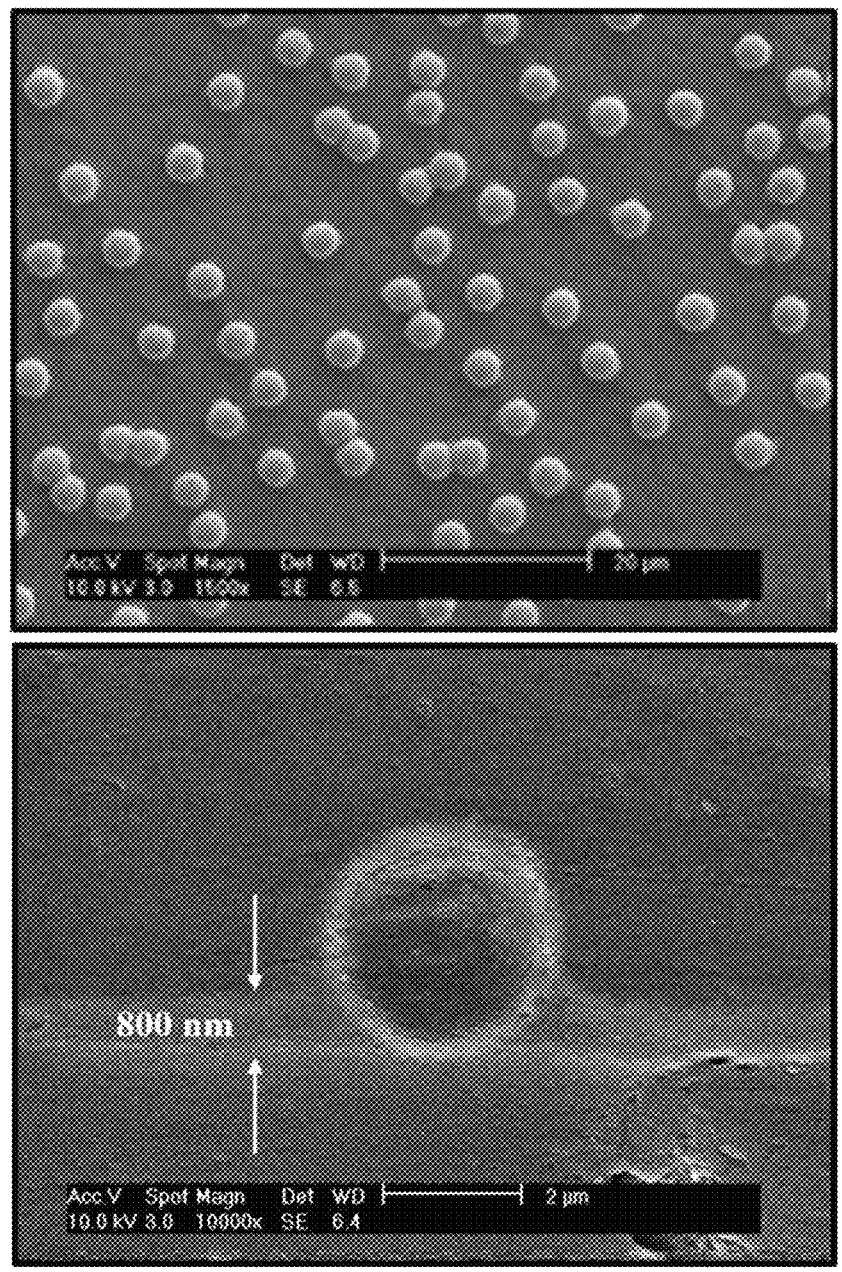
FIG. 22 shows scanning microscope photos showing a surface and cross section of a PVDF APL film fabricated using a comma roll coater according to one embodiment of the present invention.

The distributed particle rate of conductive particles included in the APL film can be maximized by controlling the length of the magnetic field structure based on the results of FIG. 21 so that an APL film fabricated through a common roll film coater stays in the magnetic field structure for at least 30 seconds. As a result, a stable APL film having the distributed particle rate of 80% can be fabricated. FIG. 22 shows scanning microscope photos showing a surface and cross section of a PVDF APL film fabricated using a comma roll coater according to one embodiment of the present invention. The above-described 30 seconds may be expanded to a specific reference time because the distributed particle rate may be changed by the intensity of a magnetic field. For example, control of the length of the magnetic field structure may be considered so that a magnetic field is applied for a specific reference time or more.

Figure 23:
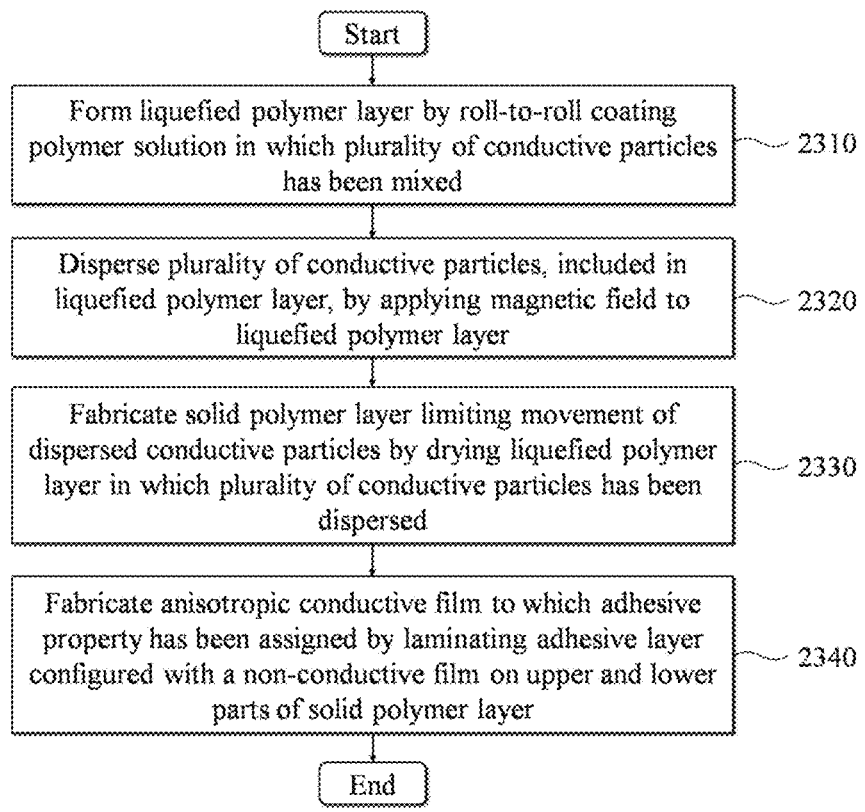
FIG. 23 is a flowchart showing an example of a method of fabricating a film according to one embodiment of the present invention.

FIG. 23 is a flowchart showing an example of a method of fabricating a film according to one embodiment. The method of fabricating a film according to the present embodiment may be performed by a film fabrication apparatus including a magnetic field structure. For example, the magnetic field structure may disperse a plurality of conductive particles included in a liquefied polymer layer through a repulsive force between the conductive particles, magnetized by a magnetic field, by applying the magnetic field to the liquefied polymer layer.

In a more detailed embodiment, the film fabrication apparatus may include a roll coater, a magnetic field structure, and a dry unit. The roll coater may correspond to the calender roll 420 described with reference to FIG. 4, for example. The magnetic field structure may correspond to the magnetic field structures 1360 and 1370 described with reference to FIG. 13 and/or the magnetic field structure 1700 described with reference to FIG. 17. Furthermore, the dry unit may be an element for forming a drying zone shown in FIG. 4. Furthermore, in some embodiments, the film fabrication apparatus may include an additional roll coater. The additional roll coater may correspond to the roll coater described with reference to FIGS. 7 and 8.

At step 2310, the roll coater may form a liquefied polymer layer by roll-to-roll coating a polymer solution in which a plurality of conductive particles has been mixed. For example, the conductive particle may include a nickel-plated polymer conductive particle.

At step 2320, the magnetic field structure may disperse the plurality of conductive particles, included in the liquefied polymer layer, by applying a magnetic field to the liquefied polymer layer. At this time, the plurality of conductive particles is magnetized by the magnetic field, and thus they can be dispersed within the liquefied polymer layer by a repulsive force occurring between the conductive particles. To this end, at step 2320, the magnetic field structure may apply a vertical direction magnetic field to the liquefied polymer layer. For example, the magnetic field structure may include at least one magnet and a magnetic shielding material for shielding the horizontal direction magnetic field of the at least one magnet, and may apply the vertical direction magnetic field to the liquefied polymer layer. At step 2320, the magnetic field structure may be implemented to apply a magnetic field of a specific reference time or more (e.g., 30 seconds or more) to the same position of the liquefied polymer layer. The stay time of the polymer layer within the magnetic field structure has been described above in detail with reference to FIGS. 20 and 21.

At step 2330, the dry unit may dry the liquefied polymer layer in which the plurality of conductive particles has been dispersed, thereby fabricating a solid polymer layer that limits a movement of the dispersed conductive particles. At this time, a distributed particle rate, that is, the ratio of a total number of conductive particles within the unit area of the solid polymer layer versus the number of conductive particles present as a unity, may be included in the range of 55% to 80%, as shown in FIG. 21.

At step 2340, the additional roll coater may laminate an adhesive layer, configured with a non-conductive film (NCF), on the upper and lower parts of the solid polymer layer, thereby fabricating an anisotropic conductive film to which an adhesive property has been assigned. A process of laminating the adhesive layer formed of the NCF on the polymer layer has been described above with reference to FIGS. 7 and 8.

As described above, according to the embodiments of the present invention, conductive particles within the anchoring polymer layer (APL) that suppresses a flow of the conductive particle can be uniformly dispersed using a magnetic field when the APL is fabricated.

Furthermore, conductive particles within the APL can be uniformly dispersed using the magnetic field structure capable of maximizing a vertical direction magnetic field.

As described above, although the embodiments have been described in connection with the limited embodiments and drawings, those skilled in the art may modify and change the embodiments in various ways from the description. For example, proper results may be achieved although the above-described descriptions are performed in order different from that of the described method and/or the above-described elements, such as the system, configuration, device, and circuit, are coupled or combined in a form different from that of the described method or replaced or substituted with other elements or equivalents.

Accordingly, other implementations, other embodiments, and equivalents of the claims belong to the scope of the claims.

What is claimed is:

1. A method of fabricating a film, comprising:
    dissolving a polymer and a solvent to form a polymer solution, wherein the polymer content is 7 wt. % or more, and wherein the polymer is selected from the group consisting of polybutadiene succinate (PBS), polyvinyl fluoride (PVDF), nylon 666, nylon 66, nylon 6, nylon 12, and polyacrylonitrile;
    forming a liquefied polymer layer by roll-to-roll coating the polymer solution in which a plurality of conductive particles has been mixed, wherein the liquified polymer layer is non-adhesive and surrounds an upper surface and a lower surface of the plurality of conductive particles;
    dispersing the plurality of conductive particles included in the liquefied polymer layer by applying a magnetic field to the liquefied polymer layer;
    fabricating a solid polymer layer limiting a movement of the plurality of dispersed conductive particles by drying the liquefied polymer layer in which the plurality of conductive particles has been dispersed;
    laminating the solid polymer layer with one or more adhesive layer configured with a non-conductive film (NCF) on upper and lower parts of the solid polymer layer; and
    removing the laminated solid polymer layer surface surrounding the upper surface and the lower surface of one or more conductive particles by a vertical direction ultrasonic bonding process.

2. The method of claim 1, wherein the plurality of conductive particles is dispersed within the liquefied polymer layer by a repulsive force occurring between the plurality of conductive particles as the plurality of conductive particles is magnetized by the magnetic field.

3. The method of claim 1, wherein dispersing the conductive particles comprises applying a vertical direction magnetic field to the liquefied polymer layer.

4. The method of claim 1, wherein dispersing the conductive particles comprises applying a vertical direction magnetic field to the liquefied polymer layer using a magnetic field structure comprising at least one magnet and a magnetic shielding material shielding a horizontal direction magnetic field of the at least one magnet.

5. The method of claim 1, wherein the drying occurs via evaporation.

6. The method of claim 1, wherein the liquefied polymer layer containing the plurality of dispersed conductive particles is formed through a gap between a first roll and a second roll in the roll-to-roll coating.

7. The method of claim 1, wherein the adhesive layer is applied via one or more roll coater.

8. The method of claim 1, wherein dispersing the plurality of conductive particles comprises using a magnetic field structure comprising at least one magnet and a magnetic shielding material shielding a horizontal direction magnetic field of the at least one magnet such that the magnetic field applied to the liquified polymer layer has a vertical direction magnetic field intensity that is at least five times greater than a horizontal direction magnetic field direction of the magnetic field.

9. The method of claim 1, wherein dispersing the conductive particles comprises applying the magnetic field to an identical position of the liquefied polymer layer for a specific reference time or more.

10. The method of claim 9, wherein the specific reference time is less than 2 minutes.

11. The method of claim 10, wherein the specific reference time is 30 seconds.

12. The method of claim 1, wherein the liquefied polymer layer comprises the plurality of conductive particles as a single layer.

13. The method of claim 1, further comprising fabricating an anisotropic conductive film to which an adhesive property has been assigned by the laminating.

14. The method of claim 1, wherein the conductive particle comprises a nickel-plated polymer conductive particle.

15. The method of claim 1, wherein a ratio of a total number of conductive particles within a unit area of the solid polymer layer versus a number of conductive particles present as a unity is included in a range of 55% to 80%.

16. A method of fabricating a film, comprising:
    dissolving a polymer and a solvent to form a polymer solution, wherein the polymer content is 7 wt. % or more, and wherein the polymer is selected from the group consisting of polybutadiene succinate (PBS), polyvinyl fluoride (PVDF), nylon 666, nylon 66, nylon 6, nylon 12, and polyacrylonitrile;
    dispersing a plurality of conductive particles within a liquefied polymer layer, comprising the plurality of conductive particles, wherein the liquified polymer layer is non-adhesive and surrounds an upper surface of a lower surface of the plurality of conductive particles, and wherein the plurality of conductive particles are dispersed through a repulsive force between the plurality of conductive particles magnetized by a magnetic field by applying the magnetic field to the liquefied polymer layer;
    laminating the solid polymer layer with one or more adhesive layer configured with a non-conductive film (NCF) on upper and lower parts of the solid polymer layer under conditions effective to limit movement of the plurality of conductive particles; and
    removing the laminated solid polymer layer surface surrounding the upper surface and the lower surface of one or more conductive particles by a vertical direction ultrasonic bonding process.

17. The method of claim 16, wherein dispersing the conductive particles comprises applying a vertical direction magnetic field to the liquefied polymer layer.

18. The method of claim 16, wherein dispersing the conductive particles comprises applying a vertical direction magnetic field to the liquefied polymer layer using a magnetic field structure comprising at least one magnet and a magnetic shielding material shielding a horizontal direction magnetic field of the at least one magnet.

19. The method of claim 16, wherein dispersing the conductive particles comprises applying the magnetic field to an identical position of the liquefied polymer layer for a specific reference time or more.

20. The method of claim 19, wherein the specific reference time is less than 2 minutes.

21. The method of claim 20, wherein the specific reference time is 30 seconds.

* * * * *